United States Patent
Rottler et al.

(10) Patent No.: US 10,332,696 B2
(45) Date of Patent: Jun. 25, 2019

(54) CARRIER AND ELECTRIC SWITCH HAVING SAID CARRIER

(71) Applicant: Marquardt GmbH, Rietheim-Weilheim (DE)

(72) Inventors: Frank Rottler, Koenigsfeld-Neuhausen (DE); Rainer Berchtold, Tuttlingen-Nendingen (DE)

(73) Assignee: Marquardt GmbH, Rieteim-Weilheim (DE)

( * ) Notice: Subject to any disclaimer, the term of this patent is extended or adjusted under 35 U.S.C. 154(b) by 0 days.

(21) Appl. No.: 15/426,450

(22) Filed: Feb. 7, 2017

(65) Prior Publication Data

US 2017/0213659 A1  Jul. 27, 2017

Related U.S. Application Data

(63) Continuation of application No. PCT/EP2015/068504, filed on Aug. 11, 2015.

(30) Foreign Application Priority Data

Aug. 15, 2014 (DE) .................. 10 2014 011 958

(51) Int. Cl.
*H05K 1/18* (2006.01)
*H01H 9/02* (2006.01)
*H01H 1/58* (2006.01)
*H01H 3/14* (2006.01)
*H01H 1/40* (2006.01)
*H05K 1/11* (2006.01)
(Continued)

(52) U.S. Cl.
CPC .............. *H01H 9/02* (2013.01); *H01H 1/021* (2013.01); *H01H 1/12* (2013.01); *H01H 1/403* (2013.01); *H01H 1/5805* (2013.01); *H01H 3/141* (2013.01); *H05K 1/117* (2013.01); *H05K 1/18* (2013.01); *H05K 1/183* (2013.01); *H05K 2201/10053* (2013.01); *H05K 2201/10446* (2013.01)

(58) Field of Classification Search
CPC .............. H01H 1/20; H01H 2205/002; H01H 2205/022; H01H 1/403; H01H 1/5805; H01H 3/141; H05K 1/117; H05K 1/183; H05K 2201/10053; H05K 2201/10446
See application file for complete search history.

(56) References Cited

U.S. PATENT DOCUMENTS

2006/0254891 A1    11/2006 Chuang

FOREIGN PATENT DOCUMENTS

JP          2007-305384 A1    11/2007

OTHER PUBLICATIONS

English translation of International Preliminary Report on Patentability (Chapter I) (Application No. PCT/EP2015/068504) dated Feb. 21, 2017, 7 pages.

(Continued)

*Primary Examiner* — Felix O Figueroa
(74) *Attorney, Agent, or Firm* — Burr & Brown, PLLC

(57) ABSTRACT

A carrier for electrical and/or electronic components is provided, in particular, a printed circuit board, having a broadside for accommodating electrical conductor tracks, and having a narrow side. At least one electrically conductive contact area is provided on the carrier, the contact area, in particular, being used as a fixed contact for an electrical switch. The contact area is arranged on the narrow side.

12 Claims, 3 Drawing Sheets

(51) Int. Cl.
*H01H 1/021* (2006.01)
*H01H 1/12* (2006.01)

(56) References Cited

OTHER PUBLICATIONS

Brand, Thomas, "Single Pole Push Switch Using Elastomeric Actuator and Edge Plated PCB," Motorola Technical Developments, Motorola, Inc., vol. 14, Dec. 1991, p. 59.
International Search Report and Written Opinion (Application No. PCT/EP2015/068504) dated. Oct. 26, 2015.

CARRIER AND ELECTRIC SWITCH HAVING SAID CARRIER

CROSS REFERENCE TO RELATED APPLICATIONS

This application is a continuation of International Application No. PCT/EP2015/068504 filed Aug. 11, 2015, which designated the United States, and claims the benefit under 35 USC § 119(a)-(d) of German Application No. 10 2014 011 958.0 filed Aug. 15, 2014, the entireties of which are incorporated herein by reference.

FIELD OF THE INVENTION

The present invention relates to a carrier for electrical and/or electrical components.

BACKGROUND OF THE INVENTION

Such carriers are used to accommodate electrical and/or electronic components.

Such a carrier is flat and has a broadside and a narrow side. In particular, the carrier can be used as a printed circuit board which simultaneously provides the electrical connection for the components by means of conductor tracks. The electrical conductor tracks are on the broadside of the carrier. An electrical switch may also be conventionally arranged on the broadside of the carrier. At least one exposed electrically conductive contact area is then provided on the broadside, the contact area being used as a fixed contact for the electrical switch. However, the functionality of such a carrier is restricted in some cases, in particular, if the carrier is used to accommodate an electrical switch.

SUMMARY OF THE INVENTION

The present invention is based on the object of increasing the functionality of the carrier. In particular, when using the carrier to accommodate an electrical switch, the intention is to generate a switching signal by means of the switch at right angles to the carrier and/or the printed circuit board, that is to say substantially at right angles to the previous actuation direction of the switch.

In the carrier according to the present invention, the contact area is arranged on the narrow side. As a result, an electrical switch can be advantageously arranged on the end-face narrow side of the carrier and/or of the printed circuit board, which was not previously used for this purpose, in a compact manner.

The carrier can expediently consist of electrically insulating material, conductor tracks which are possibly situated on the carrier consisting of electrically conductive material. The contact area can in turn consist of electrically conductive material. In a cost-effective manner, the contact area can consist of a coating with an electrically conductive metal. The coating can be partially formed on the narrow side for the purpose of saving material. This may be partial gold plating on the narrow side for the purpose of good electrical conductivity. Such gold plating has a low tendency to corrosion and is therefore durable and functionally reliable.

The electrical switch comprises at least one fixed contact and a switching contact for switching interaction with the fixed contact. According to the present invention, the fixed contact can be arranged on a printed circuit board configured in this manner, that is to say, on the end-face narrow side of the printed circuit board.

Two fixed contacts may be provided for the electrical switch. The switching contact can easily interact with the fixed contacts in a bridging manner. For the purpose of compactness, the switching contact can comprise an electrically conductive pill. The pill can consist of carbon, in particular graphite, a material which has good electrical conductivity and is nevertheless cost-effective being involved here. The switching contact can be situated on a switching mat which can be produced in a particularly cost-effective manner. The switching mat can consist of elastomeric and/or elastic plastic, in particular silicone, as a result of which the switching mat can be easily produced using injection molding. Such a switching mat is also long-lasting.

In a functionally reliable manner, the switching mat can be arranged on a carrier part. A recess can be provided in the carrier part in such a manner that the contact area is exposed for making electrical contact with the switching mat. In a compact design, the carrier part can be fastened to the end face of the printed circuit board. For the purpose of simple installation, the carrier part can rest for this purpose on the printed circuit board by means of a stop. For the purpose of reliable fastening, it may also be appropriate for the printed circuit board to be fastened to the carrier part by means of a latching hook. Finally, a fixing pin can be provided on the carrier part for the purpose of arranging the printed circuit board in a housing in order to thereby allow the printed circuit board to be easily positioned and/or fixed in the housing.

The following can be stated for a particularly preferred configuration of the present invention.

The present invention provides an end-face switching contact on a printed circuit board, with the result that a switching signal can be generated at right angles to the printed circuit board. For this purpose, the printed circuit board is partially gold-plated on the side, that is to say on its end face. The switching signal is established via a conductive pill of a switching mat. In this case, the switching mat and the printed circuit board are positioned accordingly via a carrier part.

The advantages achieved with the present invention are, in particular, the fact that it is possible to generate signals by means of an electrical switch at right angles to a printed circuit board without complicated and expensive additional parts, for example, light barriers, contact sheets or the like. Furthermore, it is possible to dispense with a cost-intensive, previously used rigid-flex printed circuit board or similar configurations. The carrier according to the present invention provides a very short tolerance chain, which is particularly advantageous in electrical switches having short-stroke buttons or short-stroke rockers or other rockers and/or pushbuttons.

BRIEF DESCRIPTION OF THE DRAWINGS

One exemplary embodiment of the present invention with different developments and configurations is illustrated in the drawings and is described in more detail below.

DETAILED DESCRIPTION OF THE INVENTION

Figure 1:
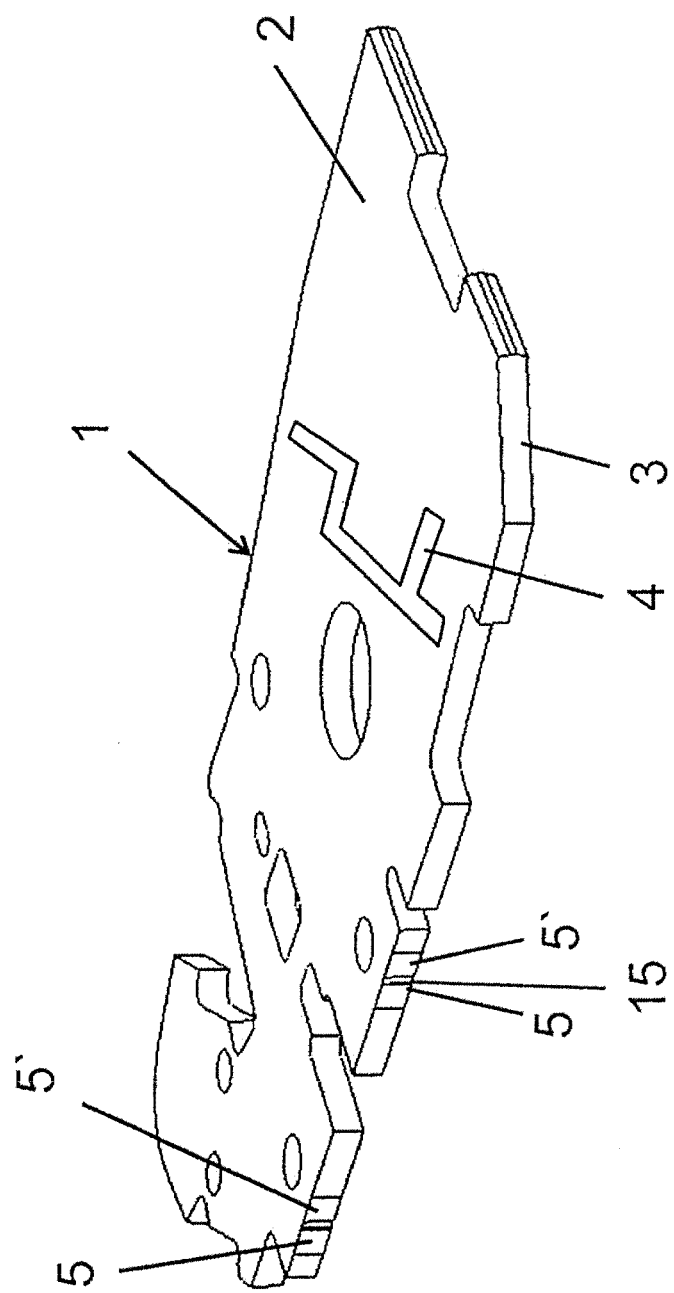
FIG. 1 shows a perspective view of a carrier.

A carrier 1 in the form of a printed circuit board for accommodating electrical and/or electronic components can be seen in FIG. 1. The flat carrier 1 has a broadside 2 and an end-face narrow side 3 and consists of electrically insulating material. Electrical conductor tracks 4 which are only schematically indicated in FIG. 1 are situated on the broadside 2 of the carrier 1, for example. One of these electrical components on the carrier 1 is, in particular, an electrical switch, for which at least one exposed electrically conductive contact area 5, which therefore consists of electrically conductive material, is provided as a fixed contact on the carrier 1. This electrically conductive contact area 5 is arranged on the narrow side 3 of the carrier 1. In the present case, the contact area 5 consists of a coating with an electrically conductive metal, the coating being carried out partially according to the size of the contact area 5. Specifically, the contact area 5 is, in particular, partial gold plating on the narrow side 3 for the sake of good functional reliability.

Figure 3:
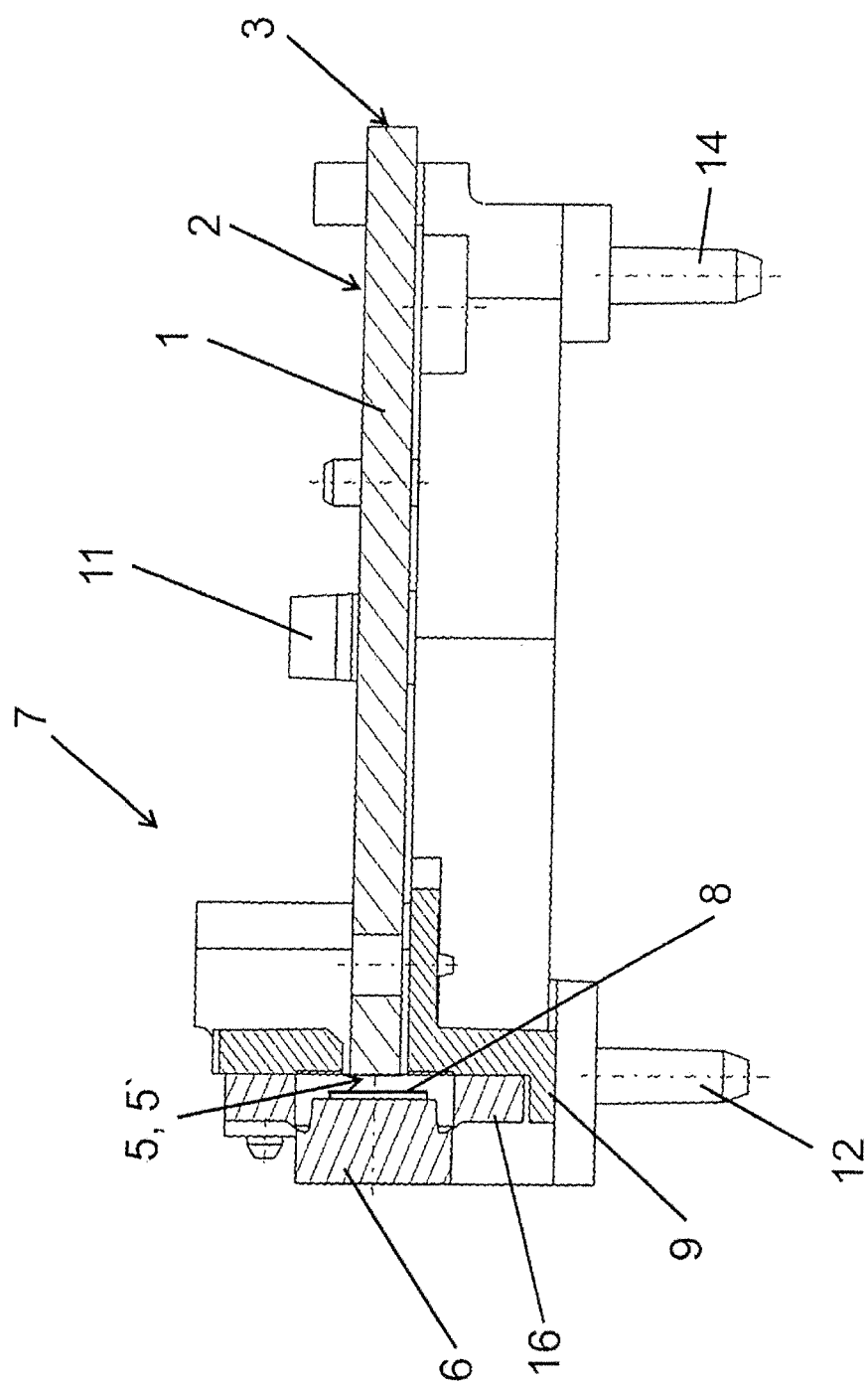
FIG. 3 shows an electrical switch according to a section along the line 3-3 in FIG. 2.

As already mentioned, the carrier 1 may be part of an electrical switch 7 which can be seen in more detail in FIG. 3. The switch 7 comprises at least one fixed contact 5 and a switching contact 6 for switching interaction with the fixed contact 5, the fixed contact 5 being situated on the narrow side 3 of the printed circuit board 1 as a contact area. In the present case, according to FIG. 1, two contact areas 5, 5' are provided as fixed contacts for the electrical switch 7 and are isolated from one another by means of an insulating area 15. The switching contact 6 then interacts with the fixed contacts 5, 5' in a bridging manner during switching.

According to FIG. 3, the switching contact 6 is situated on a switching mat 16. The switching mat 16 is produced from an elastic and/or elastomeric plastic, for example, silicone. The switching contact 6 also comprises an electrically conductive pill 8 which interacts with the fixed contacts 5, 5' as contact points at which the electrical contact can be closed. The pill 8 consists of carbon, specifically graphite with good electrical conductivity, in particular. The switching mat 6 is arranged on a carrier part 9 which can be seen in more detail in FIG. 2. A recess 10 is provided in the carrier part 9 in such a manner that the contact area 5, 5' is exposed for making electrical contact with the switching contact 6 on the switching mat 16.

Figure 2:
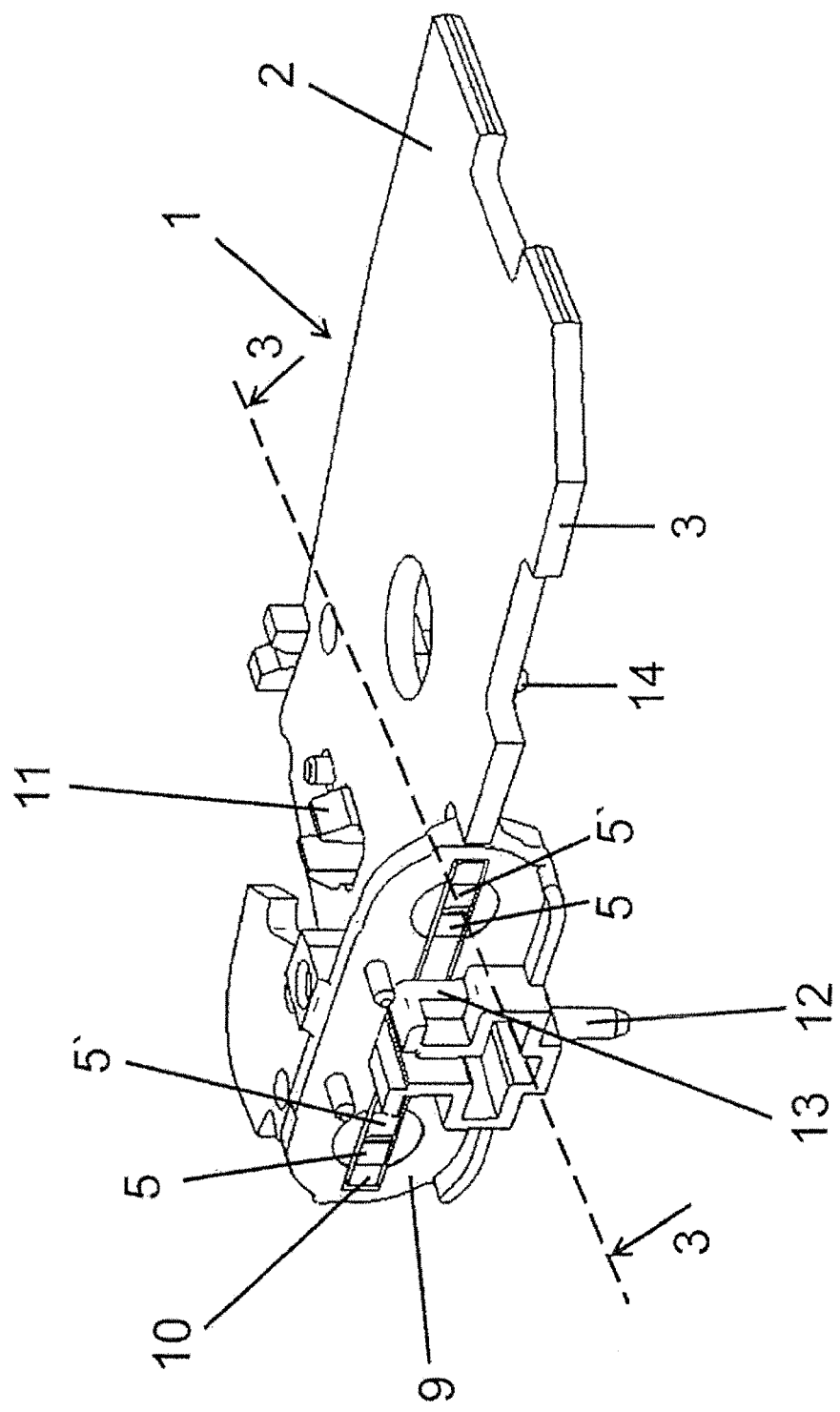
FIG. 2 shows a carrier part for an electrical switch which is provided with a carrier according to FIG. 1.

As can be seen from FIG. 2, the carrier part 9 is pushed onto a stop 13 in the carrier part 9 on the end face 3 of the printed circuit board 1. The printed circuit board 1 is pressed against this stop 13 via a further part (not illustrated here) during installation or mounting. The printed circuit board 1 is additionally fastened to the carrier part 9 via a latching hook 11. The carrier part 9 also has fixing pins 12, 14 for fastening and/or positioning the printed circuit board 1, together with the electrical switch 7, in a housing which is not shown any further.

The present invention is not restricted to the exemplary embodiment described and illustrated. Rather, it also comprises all developments carried out by a person skilled in the art within the scope of the present invention defined by the patent claims. Such a carrier 1 can, therefore, be used in a versatile manner, in particular, in a switch panel, in a multifunction switch for selecting functions or the like, which can in turn be used in a motor vehicle, in a household appliance or in another electrical device.

LIST OF REFERENCE SYMBOLS

1: Carrier/printed circuit board
2: Broadside (of the carrier)
3: Narrow side/end face (of the carrier)
4: Conductor track
5, 5': Contact area/fixed contact
6: Switching contact
7: (Electrical) switch
8: (Electrically conductive) pill
9: Carrier part
10: Recess (in the carrier part)
11: Latching hook
12: Fixing pin (on the carrier part)
13: Stop
14: Fixing pin (on the carrier part)
15: (Insulating) area (on the end face)
16: Switching mat

The invention claimed is:

1. An electrical switch, the electrical switch comprising two fixed contacts on a printed circuit board and a switching contact for switching interaction with the fixed contacts, the switching contact is situated on a switching mat, which is arranged on a carrier part, and the switching contact interacts with the fixed contacts in a bridging manner, the printed circuit board having a broadside and a narrow side, wherein the fixed contacts are arranged in an extending direction on the narrow side and a notch is formed in the narrow side on one or another side of the fixed contacts so as to be at a spaced distance from the fixed contacts, with a latching hole formed in the broadside so as to be directly adjacent to the notch in a direction perpendicular to the extending direction of the fixed contacts, and wherein the carrier part having a stop and a latching hook is fastened to the printed circuit board such that the stop in the carrier part is pressed against the narrow side of the printed circuit board along the spaced distance between the notch and the fixed contacts and the latching hole in the broadside of the printed circuit board is fastened to the carrier part via the latching hook.

2. The electrical switch as claimed in claim 1, wherein the printed circuit board consists of electrically insulating material, and wherein the contact area consists of electrically conductive material.

3. The electrical switch as claimed in claim 1, wherein the contact area consists of a coating with an electrically conductive metal, and wherein the coating is partially formed on the narrow side.

4. The electrical switch as claimed in claim 1, wherein the switching contact comprises an electrically conductive pill, and the switching mat consists of elastomeric and/or elastic plastic.

5. The electrical switch as claimed in claim 4, wherein a recess is provided in the carrier part in such a manner that the contact area is exposed for making electrical contact with the switching contact.

6. The electrical switch as claimed in claim 5, wherein a fixing pin is provided on the carrier part for the purpose of arranging the printed circuit board in a housing.

7. The electrical switch as claimed in claim 1, wherein the printed circuit board is a carrier for electrical and/or electronic components.

8. The electrical switch as claimed in claim 3, wherein the coating is partial gold plating.

9. The electrical switch as claimed in claim 4, wherein the pill consists of carbon.

10. The electrical switch as claimed in claim 4, wherein the pill consists of graphite.

11. The electrical switch as claimed in claim 4, wherein the switching mat consists of silicone.

12. The electrical switch as claimed in claim 1, wherein the printed circuit board is provided as a carrier for electrical and/or electronic components, and wherein the broadside is for accommodating electrical conductor tracks.

\* \* \* \* \*

UNITED STATES PATENT AND TRADEMARK OFFICE
CERTIFICATE OF CORRECTION

PATENT NO. : 10,332,696 B2
APPLICATION NO. : 15/426450
DATED : June 25, 2019
INVENTOR(S) : Frank Rottler and Rainer Berchtold Page 1 of 1

It is certified that error appears in the above-identified patent and that said Letters Patent is hereby corrected as shown below:

On the Title Page

Item (73) Assignee:
Please change: "Assignee: Marquardt GmbH, Rieteim-Weilheim (DE)" to -- Assignee: Marquardt GmbH, Rietheim-Weilheim (DE) --

Signed and Sealed this
Tenth Day of September, 2019

Andrei Iancu
*Director of the United States Patent and Trademark Office*